US006832171B2

(12) United States Patent
Barsoukov et al.

(10) Patent No.: US 6,832,171 B2
(45) Date of Patent: Dec. 14, 2004

(54) CIRCUIT AND METHOD FOR DETERMINING BATTERY IMPEDANCE INCREASE WITH AGING

(75) Inventors: Evgenij Barsoukov, Dallas, TX (US); Dan R. Poole, Austin, TX (US); David L. Freeman, McKinley, TX (US)

(73) Assignee: Texas Instruments Incorporated, Dallas, TX (US)

( * ) Notice: Subject to any disclaimer, the term of this patent is extended or adjusted under 35 U.S.C. 154(b) by 45 days.

(21) Appl. No.: 10/428,659

(22) Filed: May 2, 2003

(65) Prior Publication Data

US 2004/0128089 A1 Jul. 1, 2004

Related U.S. Application Data

(60) Provisional application No. 60/437,289, filed on Dec. 29, 2002.

(51) Int. Cl.⁷ .............................................. G01R 25/00
(52) U.S. Cl. .................................. 702/65; 320/132
(58) Field of Search ........................... 702/63–66, 182, 702/183; 320/132, 134, 136, 106, 116, 150, 125, 107, 139; 324/426, 430, 427, 433, 434, 429, 71.1, 425

(56) References Cited

U.S. PATENT DOCUMENTS

| 4,678,998 | A | | 7/1987 | Muramatsu | 324/427 |
|---|---|---|---|---|---|
| 5,404,106 | A | | 4/1995 | Matsuda | 324/431 |
| 5,426,579 | A | * | 6/1995 | Paul et al. | 363/126 |
| 5,451,881 | A | * | 9/1995 | Finger | 324/433 |
| 5,631,540 | A | | 5/1997 | Nguyen | 320/30 |
| 5,703,463 | A | * | 12/1997 | Smith | 320/134 |
| 6,049,210 | A | | 4/2000 | Hwang | 324/428 |
| 6,426,628 | B1 | * | 7/2002 | Palm et al. | 324/427 |
| 6,563,318 | B2 | * | 5/2003 | Kawakami et al. | 324/426 |
| 6,577,107 | B2 | * | 6/2003 | Kechmire | 320/139 |
| 6,713,988 | B2 | * | 3/2004 | Dubac et al. | 320/121 |
| 2004/0147972 | A1 | * | 7/2004 | Greatbatch et al. | 607/34 |

* cited by examiner

Primary Examiner—Edward Raymond
(74) Attorney, Agent, or Firm—W. Daniel Swayze, Jr.; W. James Brady; Frederick J. Telecky, Jr.

(57) ABSTRACT

An internal impedance of a battery (30) is automatically determined by operating a processor (13) to analyze current flowing through the battery to determine if a transient condition due to change of current is occurring and determining when the transient condition has ended. A voltage of the battery is measured while a steady current is being supplied by the battery. The present depth of discharge (DOD) of the battery is determined and a database is accessed to determine a corresponding value of open circuit voltage. The internal impedance is computed by dividing the difference between the measured voltage of the battery and the open circuit voltage at the present DOD by an average value of the steady current. A remaining run-time of the battery can be determined using a total zero-current capacity of the battery, integrating the current to determine a net transfer of charge from the battery, determining a value of total run-time that would be required to reduce the voltage of the battery to a predetermined lower limit, determining the duration of the integrating, and determining the remaining run-time by subtracting the duration of the integrating from the total run-time.

37 Claims, 8 Drawing Sheets

CIRCUIT AND METHOD FOR DETERMINING BATTERY IMPEDANCE INCREASE WITH AGING

This application claims the benefit of provisional application Ser. No. 60/437,289 filed Dec. 29, 2002.

BACKGROUND OF THE INVENTION

The present invention relates generally to a circuit and method for accurately measuring the internal impedance of a battery to permit improved accuracy in determining the "remaining run-time" of a device powered by the battery without disrupting the operation of the device.

It is well known that the calculation of "remaining run-time" of a battery powered device is dependent on accurate knowledge of the internal impedance of the battery. The voltage drop across the internal impedance of the battery or of an individual cell of the battery decreases the actual amount of power that can be delivered by the battery to the battery powered device at a particular current level before the battery voltage falls below an acceptable "safe" level specified by the battery manufacturer. Also, the amount of power that can be dissipated in the internal battery impedance decreases the amount of remaining run-time that can be provided by the battery to the battery powered device.

It also is well known that the internal impedance of the battery increases substantially as the battery ages, and more specifically, it is known that the internal impedance of the battery increases with battery "age" much more rapidly than the battery storage capacity decreases with age of the battery. For example, the battery storage capacity typically fades by only a few percent during the same period of time in which the battery impedance doubles. Battery impedance varies as much as +−15 percent even in newly manufactured battery cells. The battery impedance also depends strongly on temperature (about 1.5 times the change with 10 degree Centigrade change of temperature) and increases by a factor of roughly 2 during first ⅕ of battery life, but the amount of this increase can not be precisely predicted. All of these elements of uncertainty make the estimation of remaining battery capacity based on battery voltage under load very imprecise and no longer satisfactory for the rapidly growing reliability needs of users of battery powered mobile devices. None of the known "battery monitor" circuits and methods are capable of making accurate correction for the increase in internal battery impedance with age. This causes indications of remaining run-time of a device powered by an "aged" battery to be very inaccurate, and the error is especially large if the battery is supplying power to a high-power device that fully discharges the battery in less than two hours.

Note that the "age" of a battery is generally understood to refer more to the number of charge/discharge cycles to which the battery has been subjected than to the actual amount of time that the battery has existed.

One of the prior techniques for taking into account the change of the internal battery impedance during a determination of remaining run-time of a device powered by the battery includes making a numerical correction based on stored database information that characterizes the dependence of the internal battery impedance on cumulative charge that has passed through the battery or the number of charge/discharge cycles to which the battery has been subjected. This technique has the disadvantage that a battery monitor circuit being used is dependent on the particular type of battery being monitored. Implementation of such a battery monitor circuit requires time-consuming collection of internal battery impedance change data during prolonged charge/discharge cycling of the battery. Even if the capability and time for providing such a database are available, this method is quite imprecise because the change in internal impedance of a battery is heavily dependent on various battery operating conditions, such as temperature, charge/discharge cycling frequency, etc. Furthermore, any implementation of a battery monitor that can effectively utilize such a database is undesirably complex and expensive.

Another prior art technique for taking into account the change of the internal battery impedance during a determination of remaining run-time of a device powered by the battery includes use of an external frequency generator to produce an excitation signal that is applied to the battery and measuring the response of the battery output voltage to the excitation signal. However, this technique is not well-suited to battery monitors in mobile applications because the noise level of the voltage to be measured is very high compared to the level of the excitation signal resulting from normal operation of the battery powered device, causing inaccurate measurement. Also, the use of the external signal generator results in additional power consumption and added complexity of the battery monitor design.

Thus, there is an unmet need for a circuit and method capable of accurately indicating remaining run-time of a battery and device powered by the battery, which method and circuit are much less dependent on the "age" of the battery than is the case for the prior art.

There also is an unmet need for a circuit and method which avoid inaccuracies in determinations of present battery capacity, usable battery capacity, usable energy, and/or remaining run-time due to use of inaccurate estimates of internal battery impedance.

There also is an unmet need for a circuit and method which avoid inaccuracies in determination to present battery capacity, usable battery capacity, usable energy, and/or remaining run-time caused by frequent load switching.

SUMMARY OF THE INVENTION

It is an object of the present invention to provide a circuit and method for accurately indicating remaining run-time of a battery and device powered by the battery, which method and circuit are quite independent of the "age" of the battery.

It is another object of the invention to provide a circuit and method which avoid inaccuracies in determinations of usable battery capacity, usable energy, and/or remaining run-time, and to a slight extent, present battery capacity, due to use of inaccurate estimates of internal battery impedance.

It is another object of the invention to provide a circuit and method which avoid inaccuracies in determination to present battery capacity, usable battery capacity, usable energy, and/or remaining run-time caused by frequent load switching.

It is another object of the invention to provide a circuit and method which allows precise estimation of internal battery impedance as a criterion of battery health for diagnostic purposes without disconnecting battery from the device it is powering and without interference with device operation.

Briefly described, and in accordance with one embodiment, the present invention provides a method and system for automatically determining the internal impedance of a battery (30) by operating a processor (13) to analyze current flowing through the battery to determine if a transient condition due to change of current is occurring and determining when the transient condition has ended. A voltage of the battery is measured while a steady current is being supplied by the battery. The present depth of discharge (DOD) of the battery is determined and a database is accessed to determine a corresponding value of open circuit voltage. The internal impedance is computed by dividing the difference between the measured voltage of the battery and the open circuit voltage at the present DOD by an average value of the steady current. A remaining run-time of the battery can be determined using a total zero-current capacity of the battery, integrating the current to determine a net transfer of charge from the battery, determining a value of total run-time that would be required to reduce the voltage of the battery to a predetermined lower limit, determining the duration of the integrating, and determining the remaining run-time by subtracting the duration of the integrating from the total run-time.

In one described embodiment, an internal impedance (R(DOD)) of a battery (30) is computed by operating a processor (13) to analyze current flowing through the battery to determine if a transient condition due to change of current is occurring and to determine when the transient condition has ended. A voltage of the battery (V(DOD)) is measured while a steady current (I) is being supplied by the battery. The present depth of discharge (DOD) of the battery is determined and a database stored in a memory is accessed to determine a value of open circuit voltage (V_OCV(DOD)) of the battery for the present DOD. The internal impedance is computed by dividing the difference between the measured voltage of the battery (V(DOD)) and the value of the open circuit voltage (V_OCV(DOD)) at the present DOD by an average value (I_average) of the steady current (I). The database is updated using computed values of the internal impedance.

In one embodiment wherein a small but measurable current I_small flows through the battery during the voltage measurement, the measured voltage is corrected by the value of a voltage drop across the internal resistance of the battery due to the small but measurable current I_small flowing through the battery according to the expression V0corr=V0−$R(DOD0,T)$*I_small, wherein DOD0 is subsequently recalculated using V0corr instead of V0.

In one embodiment, a remaining run-time (t_rem) of the battery by obtaining or using a previously obtained value of a present total zero-current capacity Qmax of the battery, integrating the current (I) to determine a net transfer of charge from the battery, determining a value of total run-time (t_total) that would be required to reduce the voltage of the battery to a predetermined lower limit (Vmin), determining the duration of the integrating, and determining the remaining run-time (t_rem) by subtracting the duration of the integrating from the total run-time. The determining of the total run-time (t_total) includes operating the processor to utilize the database to determine the value of total run-time which causes the expression OCV(DOD0+t*I/Qmax,$T$)−I*R(DOD0+t*I/Qmax,T)

to be equal to the predetermined lower limit (Vmin), wherein T is the battery temperature, I is the current flowing through the battery, and R(DOD0+t*I/Qmax, T) is the internal resistance of the battery, wherein DOD0+t*I/Qmax is the DOD value at time t, and the database includes a section with parameters defining the dependence R(DOD,T) of the internal resistance as a function of DOD and T. The determining of the total run-time includes performing an iterative computing process to determine a value of total run-time (t_total) that causes the expression OCV(DOD0+t*I/Qmax,T)−I*R(DOD0+t*I/Qmax,T) to be equal to the predetermined lower limit (Vmin) for a constant power condition or a constant internal battery resistance condition.

DETAILED DESCRIPTION OF THE PREFERRED EMBODIMENTS

In accordance with present invention, the voltage drop across the internal impedance of a battery caused by external current flowing through the battery to a battery powered device is measured and utilized to accurately determine the low-frequency internal impedance of the battery, wherein the voltage drop measurement is made under various conditions of discharge of the battery in order to account for the dependence of the internal battery impedance on the depth of discharge (DOD) of the battery. The present SOC of a battery can be thought of as the presently stored charge expressed as a percentage of the maximum charge that can be stored in the battery, whereas the present depth of discharge DOD represents the charge that can be further removed until the battery voltage reaches the limiting voltage Vmin, expressed as a percentage of the maximum charge that can be stored in the battery. The DOD is expressed by the equation DOD=1−SOC.

Figure 8:
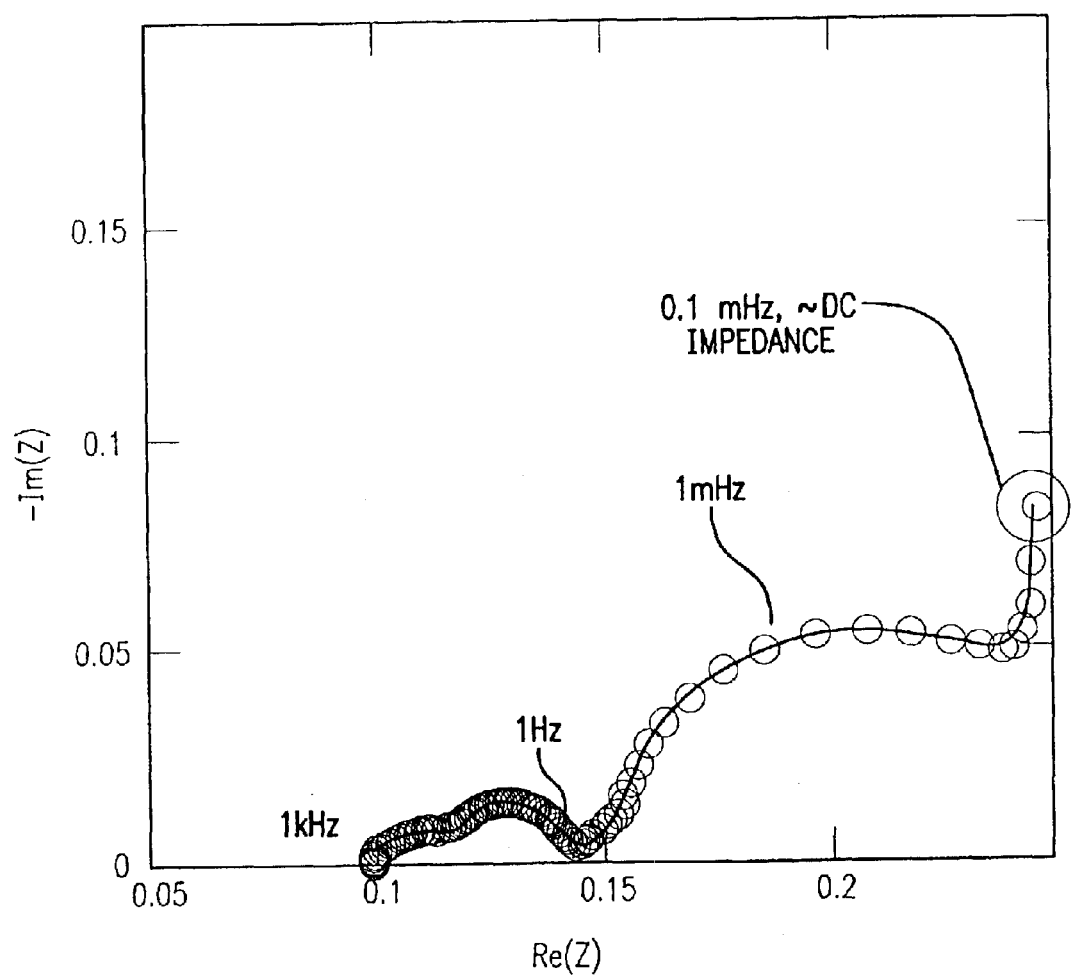
FIG. 8 is a graph showing an impedance spectrum of a battery and a point in the spectrum showing the low-frequency to which a measured battery impedance value corresponds.

During typical operation of the battery powered device there are varying switched load conditions or other transient load conditions on the battery which substantially affect the apparent battery impedance when measured on basis of terminal voltage as R=V/I. Due to the known relationship between time domain and frequency-domain representation, R measured this way will be roughly equal to value of Re(Z(f)) where frequency f=1/tau and tau is time duration since the beginning of the excitation of a battery or battery cell with current I. A typical dependence of the real part Re(Z(f)) of the complex battery impedance on the imaginary part Im(Z(f)) of the complex battery impedance measured on batteries is shown in FIG. 8. It can be seen that Re(Z) is increasing with decreasing frequency until it reaches approximately 0.1 mHz where it stabilizes. The value of Re(Z) at this frequency corresponds to the internal resistance which battery will exhibit in response to zero-frequency or direct current (DC) load. This value is of most interest for calculating battery run-time, because it corresponds to the resistance that the battery will exhibit in continuous operation. This value is referred to herein simply as the "battery impedance". To avoid the effect of such transient load conditions on the internal battery impedance measurement and hence their effect on calculation of present battery capacity, usable battery capacity, remaining run-time, and the like based on the internal battery impedance, the current being delivered by the battery to a device is analyzed to detect time intervals or "transient regions" during which high frequency battery current changes occur with sufficient magnitude to distort the battery cell voltage being measured enough to cause inaccurate determination of the internal battery impedance.

Then, the measurement of the battery voltage is avoided during such transient regions, and values of the battery voltage that are measured during prolonged regions, and values of steady battery current are utilized to compute the low-frequency internal battery impedance according to the following formula:

$$R(DOD)=[V(DOD)-V\_OCV(DOD)]/I\_average,$$

where R(DOD) is the low-frequency internal battery impedance at a given DOD of the battery, V(DOD) is the battery voltage under a loaded condition during which there is a prolonged interval of steady battery current, V_OCV(DOD) is the open circuit voltage of a battery cell at the same DOD, and I_average is the average battery current during the prolonged region of steady battery current.

The temperature dependence of the low-frequency internal battery impedance is obtained by repeating the above procedure during a number of discharge cycles of the battery, resulting in various values of R(DOD) at the same DOD for various operational battery temperatures.

Figure 1:
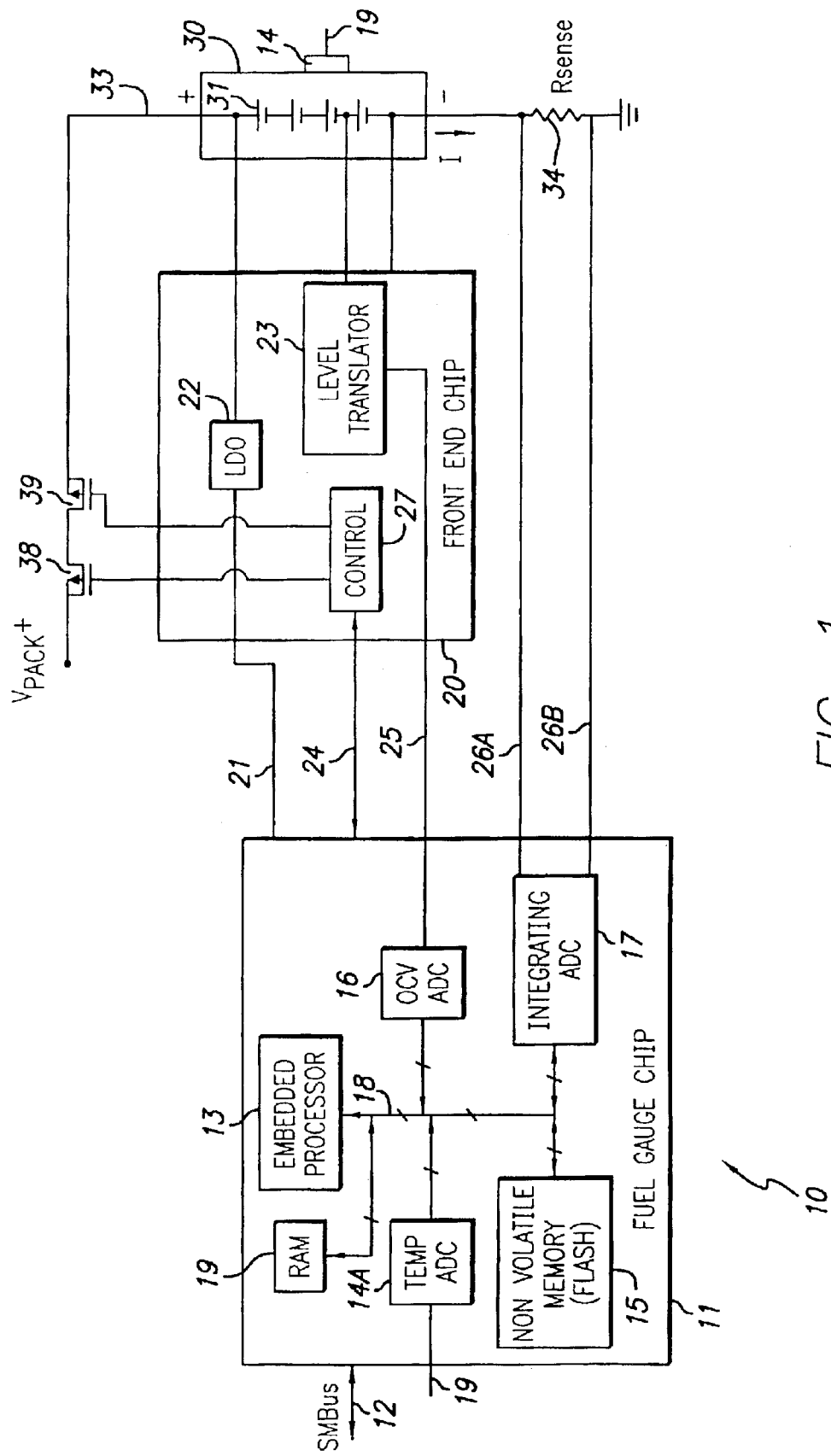
FIG. 1 is a block diagram of a "battery fuel gauge" system which includes a system for accurately determining the increase of internal impedance of a battery with age and reducing/avoiding inaccuracies in determinations of battery capacity and/or remaining run-time.

Referring to FIG. 1, a "battery fuel gauge system" 10 includes a "battery fuel gauge" integrated circuit chip 11 that includes an embedded processor 13 coupled by a bidirectional digital bus 18 to a temperature sensor circuit 14, a nonvolatile memory 15, a random access memory (RAM) 19, an analog-to-digital converter (ADC) 16, and an integrating analog-to-digital converter 17. The temperature sensor circuit 14 is coupled to an external sensor 19 which is directly attached to the battery 30 shown in FIG. 1. Nonvolatile memory 15 could be a conventional flash memory, ADC 16 and ADC 17 both can be conventional analog-to-digital converters, and embedded processor 13 can, for example, be a commercially available 8 MHz processor having an 8-bit central processing unit (CPU) and a RISC architecture. Various suitable embedded processors that are commercially available can be utilized. For example, the Assignee's MSP430 microprocessor is capable of performing the necessary computations, or an embedded processor such as the one used in the Assignee's BQ8012 fuel gauge chip can be used.

Fuel gauge chip 11 is coupled to a standard SMBus (smart bus) 12 by means of which the fuel gauge chip 11 communicates with another processor (not shown) in accordance with a suitable communications protocol. A conventional interface circuit (not shown) is coupled between SMBus 12 and digital bus 18. Fuel gauge chip 11 is powered by a supply voltage on conductor 21, which is connected to the output of a low dropout (LDO) voltage regulator circuit 22 which is included in a "front end" integrated circuit chip 20. A bidirectional digital bus 24 is coupled between conventional digital interface circuitry (not shown) in accordance with a standard I2IC in integrated circuit 11 and control circuitry 27 in fuel gauge chip 20. Front-end chip 20 also includes a level translator circuit 23 that is coupled by suitable circuitry (not shown) to measure the voltage across one (or more) of the individual lithium-ion cells 31 included in a battery 30 which is used to provide power to a utilization device (not shown) coupled between the "battery pack" terminals V+ and ground. Level translator circuit 23 produces an output that is connected by conductor 25 to the analog input of ADC 16 in integrated circuit 11. I ADC 16 converts the cell voltage to a digital equivalent that can be accessed via digital bus 18 by embedded processor 13.

The total voltage across battery 30 (which can be considered to be equal to the voltage across one of the cells multiplied by the number of cells connected in series) is applied to an input of voltage regulator 22. A 1–100 milli ohm sense resistor 34 is coupled between ground and the (−) terminal of battery 30, and the voltage across sense resistor 34 is applied as an input to integrating ADC 17, which converts the voltage across sense resistor 34 to a digital representation of the battery current flowing through sense resistor 34. The (+) terminal of battery 30 is connected by conductor 33 to the source of a power transistor 39, the gate of which is connected to control circuit 27 and front end chip 20. The drain of power transistor 39 is connected to the drain of power transistor 38, the source of transistor 39 is connected to the battery pack voltage V+, and the gate of transistor 39 is connected to control circuitry 27. The gate of transistors 38 and 39 are controlled in response to signals received by front-end chip 20 from embedded processor 13 via bus 24. Transistor 39 is a discharge transistor and transistor 38 is a charging transistor. Front-end chip 20 includes the conventional interface and control circuitry 27 coupled to bidirectional digital bus 24 in accordance with the standard I2IC protocol in order to control power transistors 38 and 39.

Various information can be sent from fuel gauge chip 11 via digital bus 24 to front-end chip 20 in order to set various levels and to transmit various safety/control information to front-end chip 20, for example to turn the power transistors 38 and 39 on and off under appropriate conditions.

Figure 2:
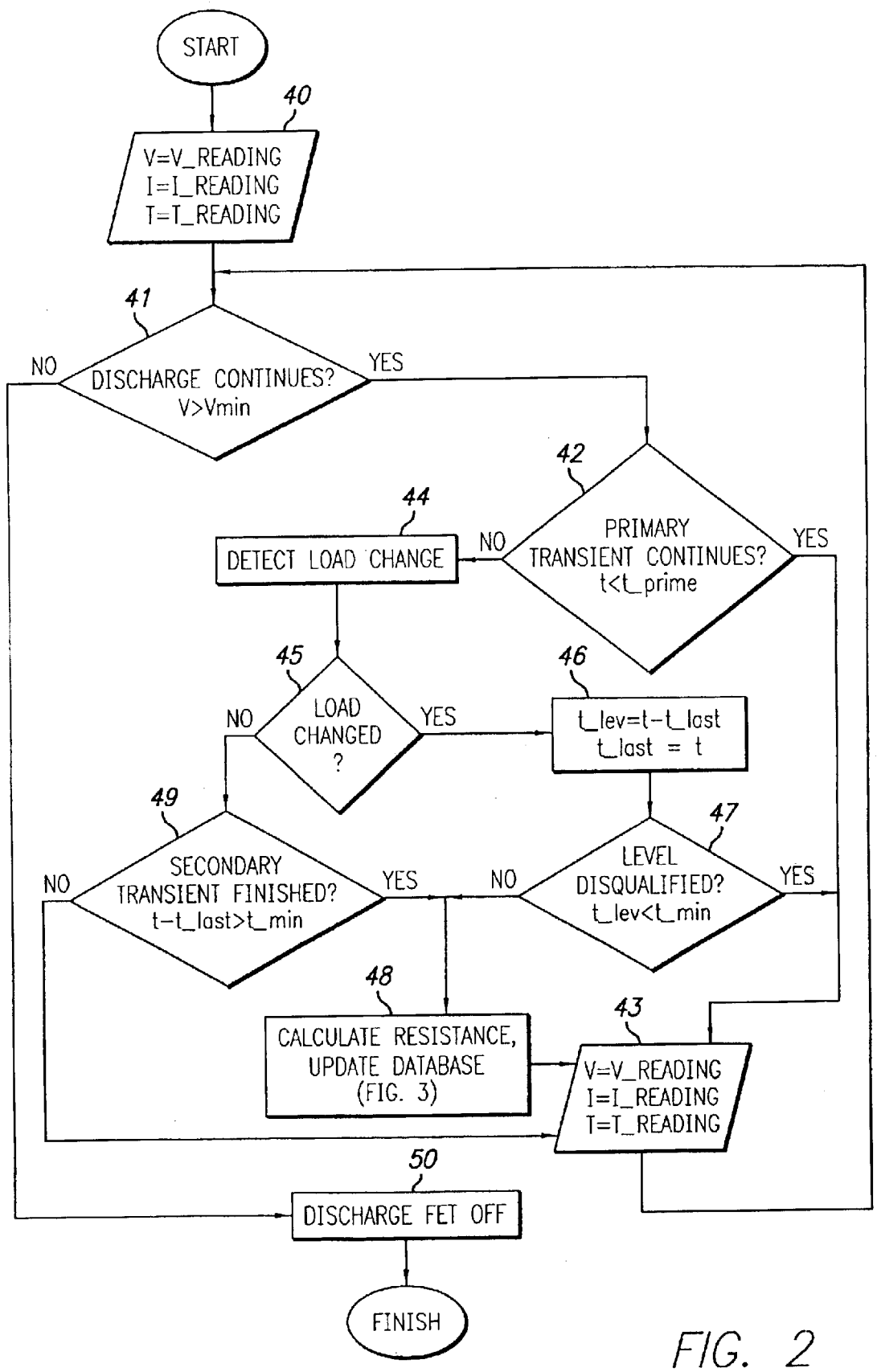
FIG. 2 is a flow chart of a program executed by the embedded processor shown in FIG. 1.

Embedded processor 13 executes a program represented by the flowchart of FIG. 2 to calculate values of the internal resistance R of battery 30 in accordance with the present invention and update a database of parameters defining the dependence of internal resistance on the battery DOD and temperature. The database is utilized as subsequently explained to obtain the information needed to make accurate remaining run-time calculations. Embedded processor 13 also executes a program represented by the subsequently described flowchart of FIG. 5 to effectuate entry of a database into flash memory 15 representative of characteristics of battery 30, values of measured open circuit voltages (OCV) of battery 30, and determinations of "starting DOD"

values that correspond to the most recently measured values of OCV after the battery has stabilized. Embedded processor 13 also executes programs to determine the present DOD of the battery, the present battery capacity, and the remaining run-time of the device powered by the battery.

The program of FIG. 2 is executed after a predetermined interval, usually equal to the sampling interval of ADC 16 after a predetermined interval, usually equal to the sampling interval of ADC 16, during every discharge cycle by embedded processor 13 by first entering block 40 and reading present values of battery voltage, current, and temperature produced on internal digital bus 18 of fuel gauge chip 11 by ADC 16, integrating ADC 17, and temperature sensor circuitry 14, respectively. (The battery voltage can be represented, as a practical matter, by the voltage across a single cell 31. The total battery terminal voltage and the charge capacity of the entire battery can be easily determined if the voltage and charge capacity of a single cell are known by simply summing the voltage is of the individual series-connected cells and also summing the charge capacities of the individual cells.)

Next, the program goes to decision block 41 and determines if the present discharge cycle of the battery is continuing, by determining if the present voltage V exceeds the manufacturer's "terminal" voltage (i.e., minimum safe voltage) Vmin. If this determination is negative, the program causes front end chip 20 to turn off discharge transistor 39. If the determination of decision block 41 is affirmative, the program goes to decision block 42 and determines if a "primary transient" of the battery voltage caused by turning off a utilization device powered by battery 30 is continuing. This is accomplished by determining if the present time t which began when the present discharge cycle of the battery began (i.e., when the utilization device was turned on or was operatively connected to battery 30) exceeds a predetermined time t_prime, which may be a typical 1000 second battery time constant.

If the primary transient is continuing, the program does not update the internal battery resistance value, and instead goes to block 43 and again reads the values of V, I, and T as previously done in block 40, and then returns to the entry point of decision block 41. If the primary transient is over, the program goes to block 44 and executes a routine which detects any substantial change in the load on the battery, for example, a change from 200 milliamperes to 250 milliamperes. The program then goes to decision block 45 and determines if a significant load change was detected, and if this determination is affirmative, the program goes to block 46 and sets a time quantity t_lev to the time t-t_last at which the load changed, wherein t is the present time, t_last is the time when the load was most recently changed, and t_lev is the direction of change the previous load. In block 46, the program also sets t last equal to the present time t, so the new value of t_last is the beginning of the present load.

Then, in decision block 47 the program determines if the duration t_lev of the previous load is long enough that the previous primary transient has adequately diminished. If not, the previous load is "disqualified". This is considered to have occurred if the duration t_lev does not exceed a time t_min, which may be approximately 100 seconds.

If t_lev is less than t_min and the determination of decision block 47 is affirmative, the program takes a present reading of the battery voltage, current, and temperature in block 43 and then re-enters decision block 41. If the determination of decision block 47 is negative, the program goes to block 48 and executes the battery resistance computation routine of FIG. 3 to calculate the internal battery resistance and update the database, and then takes another reading of the battery V, I, and T readings in block 43.

If the determination of decision block 45 is that the load has not substantially changed, the program goes to decision block 49. It should be understood that there are two situations where the load can be considered to have changed, or diminished. One situation is that it is determined that the load level sufficiently diminished, and the time point when the load level sufficiently diminished is recorded. The other situation is that the load level did not change within a certain amount of time, in which case the present time is recorded. In block 49, if t minus t_last is greater than t_min, a "secondary transient" attributed to a load change is considered to have finished, and the program calculates a new internal resistance data point and update the database by going to block 48 and executing the routine of FIG. 3. The program then goes to block 43 and takes the present battery V, I and T readings and then returns to the entry point of decision block 41. A "secondary transient" is considered to be caused by a substantial load change, for example from 200 milliamperes to 100 milliamperes. If the determination of decision block 49 is negative, the program goes to block 43 and updates the battery voltage, current, and temperature and then returns to decision block 41.

Figure 3:
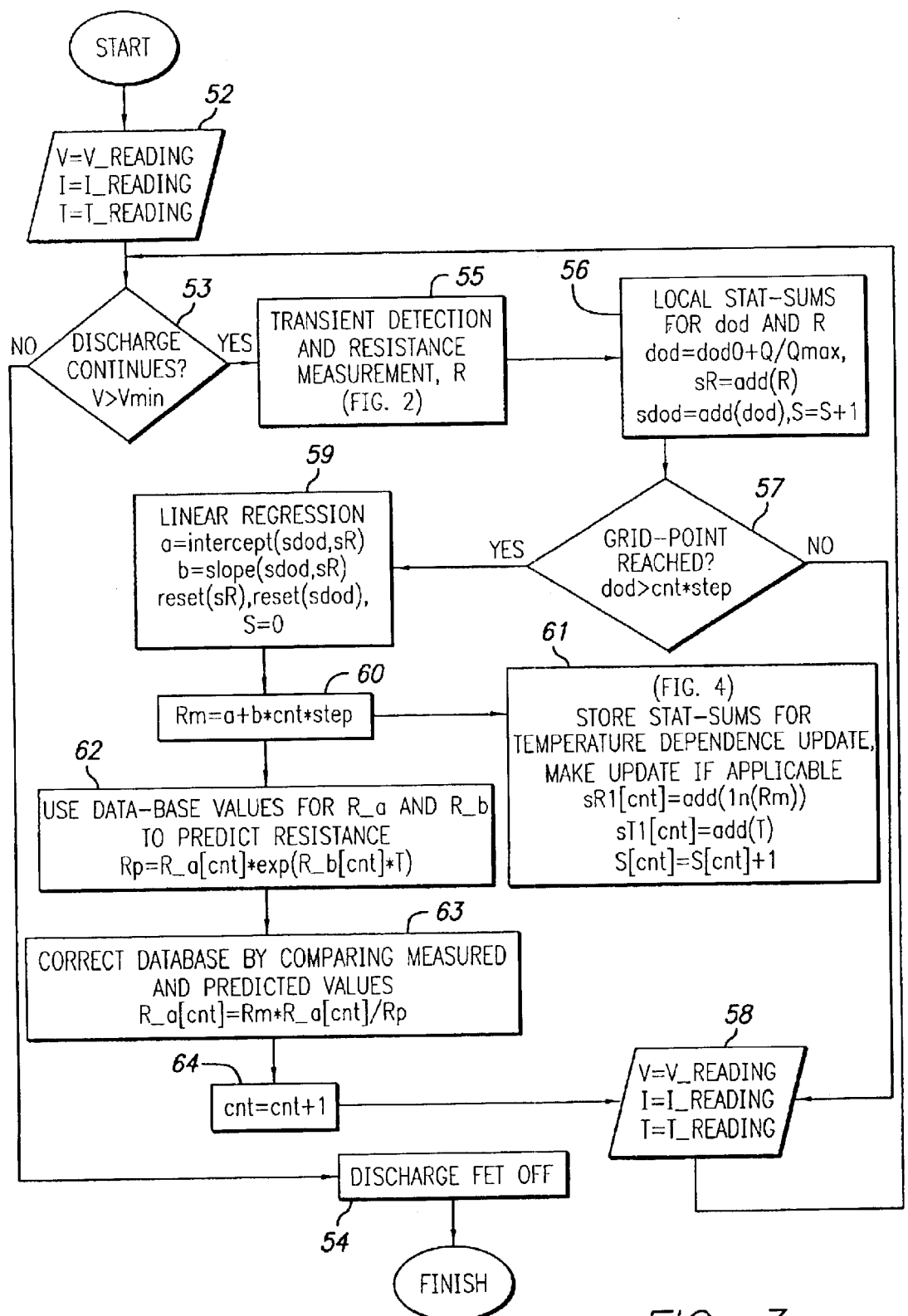
FIG. 3 is a flow chart of a routine included in the program of FIG. 2 for updating a database of internal battery resistance values.
Figure 4:
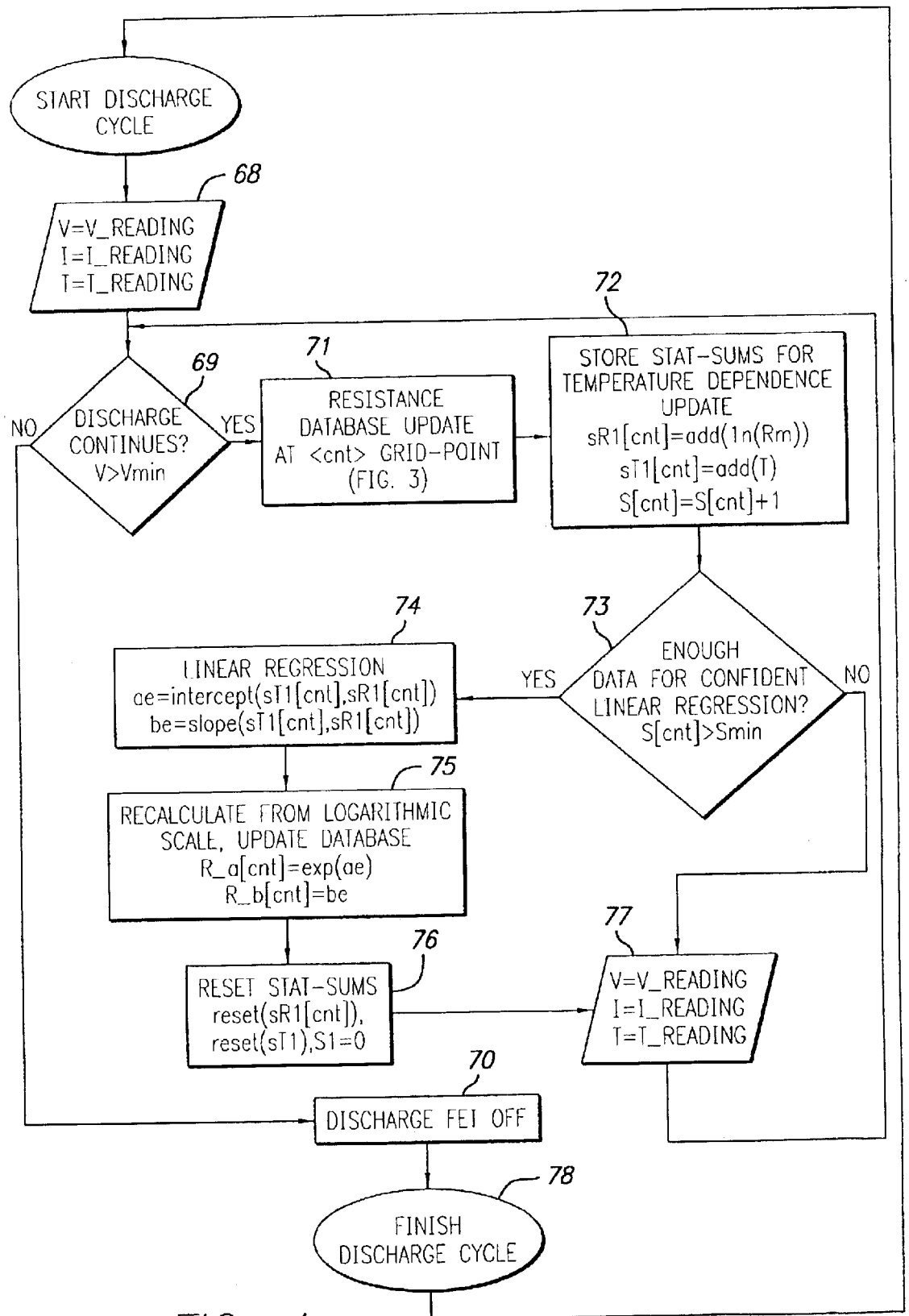
FIG. 4 is a flow chart of a routine included in the routine of FIG. 3 for updating internal battery resistance values as a function of temperature.

The data points of the above-mentioned database are stored in nonvolatile memory 15 after they are calculated by embedded processor 13 in accordance with the program of FIGS. 2–4. The data in the database is used later to determine the remaining run-time, by executing conventional root finding algorithms to iteratively obtain numerical solutions to equations which cannot be solved analytically.

FIG. 3 illustrates the routine (blocks 55–64) executed every time when a condition for resistance measurement has been found to be satisfied by the routine in FIG. 2 for calculating the internal battery resistance R, updating parameters defining the dependence of R on DOD and updating the database used for performing linear regressions, and is entered from block 48 of FIG. 2. Referring to FIG. 3, the routine begins by reading the current battery V, I and T values in block 52 and then determining in decision block 53 whether the above-mentioned discharge is continuing. This determination is the same as in previously described decision block 41 of FIG. 2. If the determination of block 53 is negative, the program turns discharge transistor 39 off in block 54, at which point the present discharge cycle is complete, and a new discharge cycle can begin. If the determination of decision block 53 is affirmative, the program goes to block 55 and performs the previously described transient detection and internal battery resistance measurement operations of blocks 42, 44, 45, 46, 47, 48, and 49 of FIG. 2, and then goes to block 56. In block 56 conceptually represents the accumulating of values of DOD (depth of discharge) of the battery and battery resistance R sufficient for producing an acceptable linear regression from such values in order to compute the parameters defining the temperature dependence of the internal battery resistance. As a practical matter, it has been found to be more economical on a real-time basis to modify several intermediate values, referred to herein as "stat-sums", while modification of their values is not necessarily restricted to simple addition, with a measured new value and corresponding DOD instead of accumulating, for example, an array of 10 values of DOD and 10 values of R, in order to calculate the linear regression in real time, wherein every new point is in memory and added to a particular sum. For example, when 100 points have already been used to modify the stat-sums, then a final calculation can be made which provides the values a and b of the linear regression. There are many well known numerical algorithms for performing linear regression without accumulating arrays of X and Y data, such as for example one described in "Numerical Recipes in Fortran, Second Edition", William H. Press, Saul A. Teukolsky, William T. Vetterling, Brian P. Flannery, Cambridge University Press, 1992, p. 655.

The program goes from block 56 to block 57. The grid-point referred to in block 57 is used by the program in the process of accumulating and storing the DOD values and R values subsequently needed to perform the linear regression. The data points for values of parameters for defining the dependence of R on DOD are stored as a column of a table consisting of, for example, 10 rows and 2 columns. The grid points provide a mechanism for determining when points in the database need to be updated. A grid point being reached corresponds to when the next point in the stored table is reached. For example, 10 rows corresponds to 10 values of DOD. If the present DOD of the battery becomes larger than, for example, 0.1 DOD that means the next grid point has been reached, and that means it is now necessary to update that particular DOD value in the database. The count "cnt" is the incremented grid point count produced in block 64, and the term "step" is the incremented of DOD with each next row in the database. For example, when a discharge cycle of the battery begins, the first grid point count cnt is 0, corresponding to DOD0. The next grid-point corresponds to DOD1, and cnt will be 1, etc. The value of DOD1 then will be equal to cnt*step; that is, if step is 0.1, then DOD1 will be 0.1*1=0.1.

In block 60 of FIG. 3, the program computes a point of "measured" resistance Rm at a particular grid point using the intercept a and slope b. Rm is an intermediate value that is constructed from the most recent pass through block 59.

After computing the measured resistance value Rm in block 60, the program goes to block 61 and executes the routine represented by the flowchart in FIG. 4, and also goes to block 62 and computes a "predicted" resistance value Rp, based on information in the database at the present gridpoint, as a function of the "DOD dependence" term R__a and the "temperature dependence" term R__b for the current value of cnt. (The database can consist of two columns, one for R__a, and the other for R__b, which is the temperature dependence term. R__a is an array of DOD-dependent values, and R__b is an array of temperature-dependent values.) At that point, both a measured resistance and a predicted resistance for the same grid point have been obtained. The program then goes to block 63 and uses Rm and Rp to correct the database value for the present grid point according to the expression R__a[cnt]=R__a[cnt]*Rm/Rp. The corrected new value of R__a to be written into the database at the present grid point at the present temperature T is R__a [cnt], which is obtained by multiplying the present value of R__a [cnt] by a correction factor Rm/Rp. Then the program goes to previously mentioned block 64 and increments cnt to indicate that the next row in the table is to be updated. The program then goes to block 58 and takes the present readings of battery V, I and T, and then returns to the entry point of decision block 53.

It should be noted that a discharge cycle does not necessarily have to be finished by reaching the minimum safe voltage Vmin every time, it can be terminated whenever user decided to cease operation of the device, and followed by a charge cycle before being completely discharged. The method described herein is applicable to any combination of complete/incomplete charges and discharges as required by particular application. It is not necessary that all data-base values in the table be updated during any particular discharge cycle, since updated values depend on the starting and finishing DOD of each cycle. Values not updated in a particular cycle with values of DOD less then the smallest updated DOD can be scaled by the same factor Rm/Rp as the smallest updated DOD. Similarly, non-updated values with DOD larger than the largest updated DOD can be scaled by the same factor Rm/Rp as that of the largest updated DOD.

In above-mentioned block 61 of FIG. 3, the program executes the routine represented by the flow chart and FIG. 4 to update the database to indicate that dependence of the battery resistance R on temperature. Referring to FIG. 4, which typically is executed approximately every five discharge cycles, the program enters block 68 and measures present values of the battery voltage, current, and temperature and then enters decision block 69, which like decision block 41 in FIG. 2, determines if the present discharge is continuing. If this determination is negative, the program turns discharge transistor 39 off to end the present discharge cycle, and the next discharge cycle can begin. If determination of decision block 69 is affirmative, the program goes to block 71 and performs a resistance database update by executing the previously described routine of FIG. 3, and then goes to block 72.

A specific purpose of the routine of FIG. 4 is to update the previously mentioned R__b column of temperature-dependent values in the database for a suitable number of temperatures, with the battery DOD unchanged. This means it is necessary to accumulate the statistical sums indicated in block 72 during a number of discharge cycles, rather than during one single discharge cycle. Note that expression "statistical sums" is used here by convention and means "parameters which are modified with each new data-point and used subsequently to calculate linear regression parameters". Modification is not restricted to summation and may vary dependent on particular algorithm used. To get fresh data, it is necessary to collect battery resistance R and temperature T data for each DOD (i.e., for each value of "cnt") in the table used to define resistance dependence on DOD and temperature T during a number of discharge cycles, under a number of different temperature conditions, and this is all accomplished automatically during the various discharge cycles into the battery powered user device.

In block 71 of FIG. 4, the program stores the value of Rm for each particular DOD in the course of executing the above described routine of FIG. 3, and the count cnt will always be the same for each pass through the routine of FIG. 4. In block 72, the program in effect (i.e., conceptually), stores cumulative statistical sums for resistance and for temperature by adding new values to the statistical sums, using well known statistical tools. See the reference "Numerical Recipes in Fortran, Second Edition", William H. Press, Saul A. Teukolsky, William T. Vetterling, Brian P. Flannery, Cambridge University Press, 1992, p. 655 for information regarding accumulating statistical sums. (As an example, to make a linear regression from a data of two arrays x and y, it is necessary to have a system of equations. The analytical solution of the system can be expressed in a form which is the sum of all x values. The final solution requires x variables. One variable could be called, for example, statistical sum sx. The sum of all y values could be called the statistical sum sy. Then the statistical sum which is the sum of all multiplied x and y values could be called the statistical sum sxy. The term s could be a counting of all of the numbers of data. When all of those variables have been obtained, intercepts a and slopes b can be computed by a simple formula.

However, the foregoing method may not be numerically efficient, and an actual iterative calculation can be accomplished more efficiently wherein the previous values of the various variables are updated using a different algorithm (rather than simply being summed) for every step, i.e., for every value of T. The program goes to decision block 73 and determines if enough data has been stored to provide an acceptable linear regression, by determining if S[cnt] is greater than a minimum value Smin (which for example, could be 4, but must be at least 2). Alternatively, statistical measures, such as standard deviation can be used to determine if enough data are stored. If there is not enough data, the program does not update the database, and instead goes to block 77 and takes the present reading of the battery voltage, current, and temperature, and perhaps continues for several more battery discharge cycles at different temperatures before decision block 73 is able to make an affirmative determination for the present DOD of the battery. (Note that there is no correlation between a particular DOD and a particular discharge cycle, and also that a number of discharge cycles may be required before enough data has been obtained for the present DOD value to obtain an affirmative determination and decision block 73, Furthermore, the particular discharge cycle can begin with one DOD and end with another different DOD, whereas the algorithm of FIG. 4 must be performed for a single DOD value. That is, the DOD values for which updating of temperature dependence will be performed at a particular cycle can be thought of as being user-determined.)

When decision block 73 makes an affirmative determination that there is enough data for suitable linear regression, the program goes to block 74 and, using well known techniques, performs the linear regression to determine an intercept ae and a slope be for the straight line to be determined by the linear regression. (See the above mentioned reference by William H. Press, Saul A. Teukolsky, William T. Vetterling, and Brian P. Flannery for a well-known technique of performing a linear regression.) The program then goes to block 75 and recalculates R_a from the parameter "ae" obtained in logarithmic scale, because the dependence of R on temperature is exponential. In order to make a linear regression from the stored statistical sums, a logarithmic scale must be used. That was accomplished in block 72 by adding the term ln(Rm). Therefore, the statistical sum of the logarithm of Rm was accumulated in block 72 after the parameters a and b of the straight line are calculated, they have to be converted back to exponential form in block 75 for R_a (but not for R_b, R_b=be). At that point the database has been updated for the present value of the battery DOD.

In block 76, the program resets the variables to 0 in order to start accumulating the statistical sums for the next update period (i.e., the period when enough data points will be accumulated for a given grid-point so that S[cnt]>Smin. The program begins that process by going to block 77, measuring the present values of the battery V, I and T, and reenters decision block 69.

It should be understood that algorithm of FIGS. 2 and 3 can be utilized to provide updating the dependence of the internal resistance on DOD sufficient for fairly accurate computations of remaining run-time without updating the temperature dependence as accomplished using the routine of FIG. 4, provided that accurate parameters representing the temperature dependence have been measured beforehand and stored into memory 15. The temperature dependence of the battery impedance is not likely to change significantly with battery cycle life. However, slightly more precise results, specific for each particular cell, can be obtained by also using the routine of FIG. 4.

If the battery impedance dependence on DOD and temperature are updated as described above, it is possible to calculate the remaining battery run-time and other characteristics describing the battery condition. To accomplish this, additional values characterizing battery condition, e.g. DOD and Qmax as well as open circuit voltage (OCV) dependence on DOD and temperature have to be obtained by conventional means.

To understand how various values of the DOD can be used, it should be understood that the amount of charge actually available from the battery to power a device drawing a substantial amount of load current is less than the total no-load battery capacity because the actual voltage of a battery with a load current flowing through its internal impedance is reduced to the manufacturer's "safe" termination voltage Vmin more quickly for higher values of load current and/or higher values of internal battery impedance due to the voltage drop across the internal battery impedance. This is evident from the equation $$V(DOD)=OCV(DOD,T)-I*R\_battery(DOD,T), \quad (Eq. 1)$$

where V(DOD,T) is the battery voltage at a particular DOD and temperature and R_battery(DOD,T) is the battery impedance at that DOD and temperature. The total no-load (i.e., zero-current) battery capacity Qmax is obtained for use as an intermediate parameter in computing the actual available battery capacity at a particular load current I, and is determined from the open-circuit battery voltage OCV0 measured just before the beginning of a particular discharge cycle, the open-circuit battery voltage OCV1 just after the discharge cycle, and the stored database that defines the relationship between DOD and OCV, i.e., DOD (OCV), for the battery. The basic equation for Qmax is $$Qmax=Q/(DOD1-DOD0), \quad (Eq. 2)$$

where Q is the net or total amount of charge that has passed through the battery during a charge (or discharge) cycle. Since the values of DOD0 and DOD1 at the beginning and end of the particular discharge cycle referred to are obtained from the database relating OCV and DOD, the above equation for Qmax can be more usefully expressed as $$Qmax=Q/[DOD(OCV1,T1)-DOD(OCV0,T0)]. \quad (Eq. 3)$$

A present remaining capacity Qrem of the battery can be determined by obtaining the value of the product of the present total zero-current capacity Qmax and the quantity (1 minus the present depth of discharge DOD_present.

The DOD(OCV,T) dependence or characteristic is generally applicable to all batteries having a particular chemistry. For example, a comparison of the OCV vs. DOD for four different batteries from four different manufacturers shows that the OCVs do not differ by more than approximately 5 millivolts, so the same database can be used for all (e.g., lithium ion) batteries of the same chemistry. Each OCV measurement is made for a known DOD, the first OCV measurement being made when the battery has been fully charged and relaxed. Similarly, the next OCV measurement is made after a known amount of charge has been discharged from the battery and it has relaxed, so the second DOD is known, and so forth for each additional OCV measurement, until one of the successively measured OCV values is reduced to manufacturer's Vmin.

Qmax, the total or fully-charged zero-current capacity of the battery, is computed no more than once for each charge/ discharge cycle, from the OCV value immediately before the beginning of the charge/discharge cycle, the OCV value of immediately after the end of the charge/discharge cycle, and the external charge Q which flows through the battery during the charge/discharge cycle.

As subsequently explained, the remaining run-time for the present battery-powered device can be computed from Qmax.

Figure 7A:
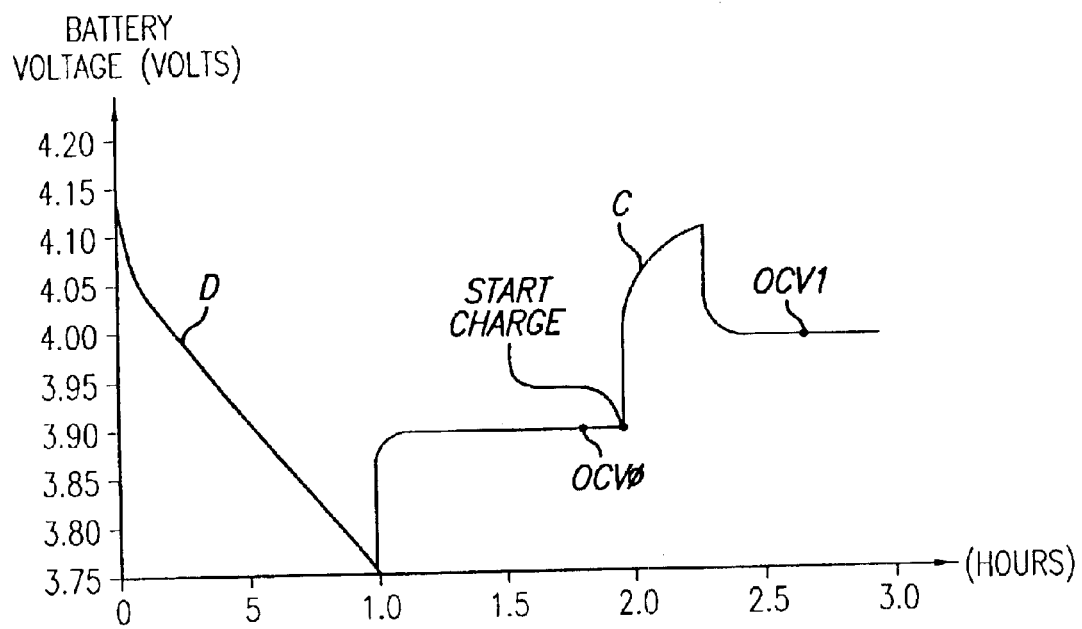
FIG. 7A is a graph of a battery relaxation curve illustrating open-circuit battery voltage as a function of time before and after a charging cycle.
Figure 7B:
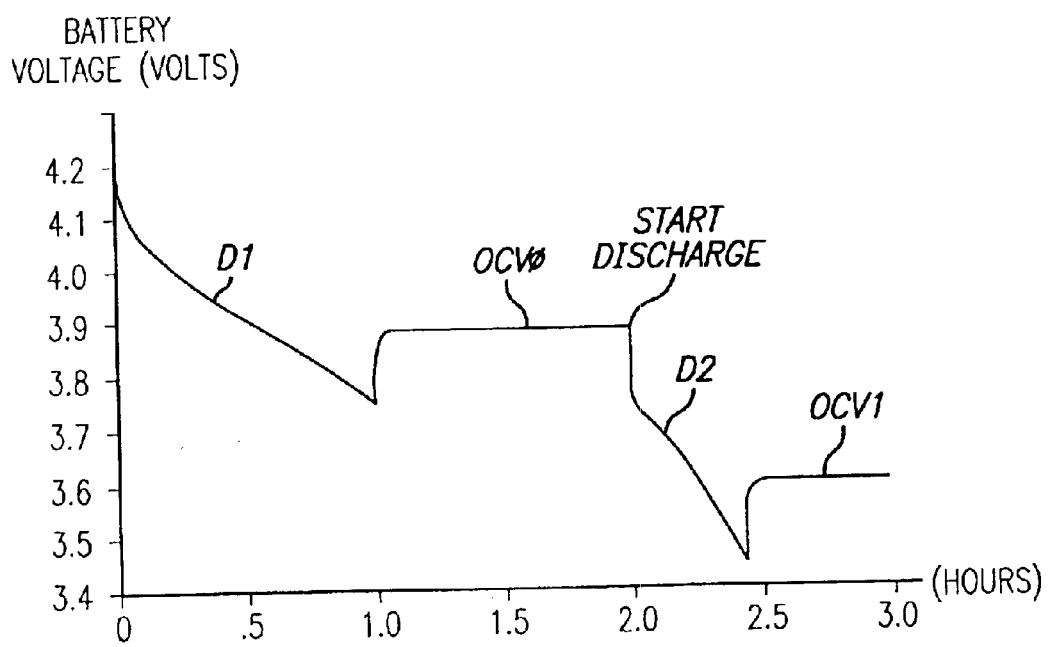
FIG. 7B is a graph of a battery relaxation curve illustrating open-circuit battery voltage as a function of time before and after a discharging cycle.

In accordance with the present invention, the open circuit battery voltage OCV is measured (or determined on the basis of cell voltage measurements) at various times after sufficiently long relaxation intervals during which the battery is not appreciably loaded. The most recent OCV measurement before a discharge cycle is utilized to determine a corresponding starting DOD from a characteristic curve represented by a look-up table that correlates no-load cell voltage measurements of the "relaxed" battery to its present DOD values. Similarly, an OCV measurement after the discharge cycle has ended and the battery has relaxed is utilized to determine a corresponding ending DOD from the lookup table, and Qmax is determined on the basis of the starting DOD and ending DOD of the discharge cycle. Appropriate times for the measurement of OCV0 after battery 30 has relaxed from a discharge cycle D and for the measurement of OCV1 after a charging cycle C are illustrated in FIG. 7A. Similarly, appropriate times for the measurement of OCV0 after battery 30 has relaxed from a discharge cycle D1 and for the measurement of OCV1 after the battery has relaxed from a another discharge cycle D2 are illustrated in FIG. 7B. By way of definition, the term "zero-current" or "no-load conditions" as used herein refers to a condition in which the battery current is sufficiently low that it does not introduce significant error in the determination of the OCV of the battery.

When a value of Qmax based on the present "age" of the battery is known, and a starting DOD for a present discharge cycle also is known, a conventional battery monitor circuit (such as the combination of sense resistor 34 and integrating D/A converter 17, or other implementation such as a simple ADC having its output integrated by a processor, or an implementation based on use of the voltage-to-frequency converter) can be used to integrate the load current I supplied to the battery-powered device to obtain a precise value of the total charge Q supplied by the battery. The DOD change (ΔDOD) which occurred during the present discharge is equal to the charge supplied by the battery divided by the maximum possible charge Qmax. This DOD change ΔDOD is subtracted from the most recent starting DOD i.e., DOD0, and the result provides an accurate indication of the present DOD, from which the presently stored charge can be determined and utilized to determine the remaining discharge time of the battery. On the other hand, if Qmax is not yet known, then two DOD points are required, one before and one after the charge or discharge, and the charge Q transferred during the time between those two points also is required, in order to determine Qmax.

To obtain the data needed for the above-mentioned stored table, is necessary to measure K values of OCV at known corresponding values of DOD at each of N temperatures T1, T2 . . . TN. Then, to generate the database, a linear regression is performed for the first of the DOD values obtained by measuring the OCV for the first DOD for each temperature T1, T2 . . . TN in order to provide data on which a linear regression can be performed to obtain intercepts A[k] and slopes B[k] for the straight-line equations represented by $$V[k](T)=A[k]+B[k]*T,\qquad\text{(Eq. 4)}$$

where k represents the first of the K DOD values of the battery. Then the procedure is repeated for the remaining DOD values, so there are K equations having the form of Equation 4. The database stored in nonvolatile memory 15 of FIG. 1 includes the intercepts A[k] and slopes B[k]. Note that the A[k] and B[k] intercept and slope values are actually stored in the database, but that neither the values of DOD or T are stored in the database. If the algorithm receives the temperature T and DOD as inputs, it can compute the corresponding OCV, i.e., the corresponding value of V[k](T) using Equation (4).

Since no analytical expression for DOD as a function of T and OCV is available, the K Equations 4 are solved iteratively to obtain the needed value of DOD from known corresponding values of OCV and T.

Figure 5:
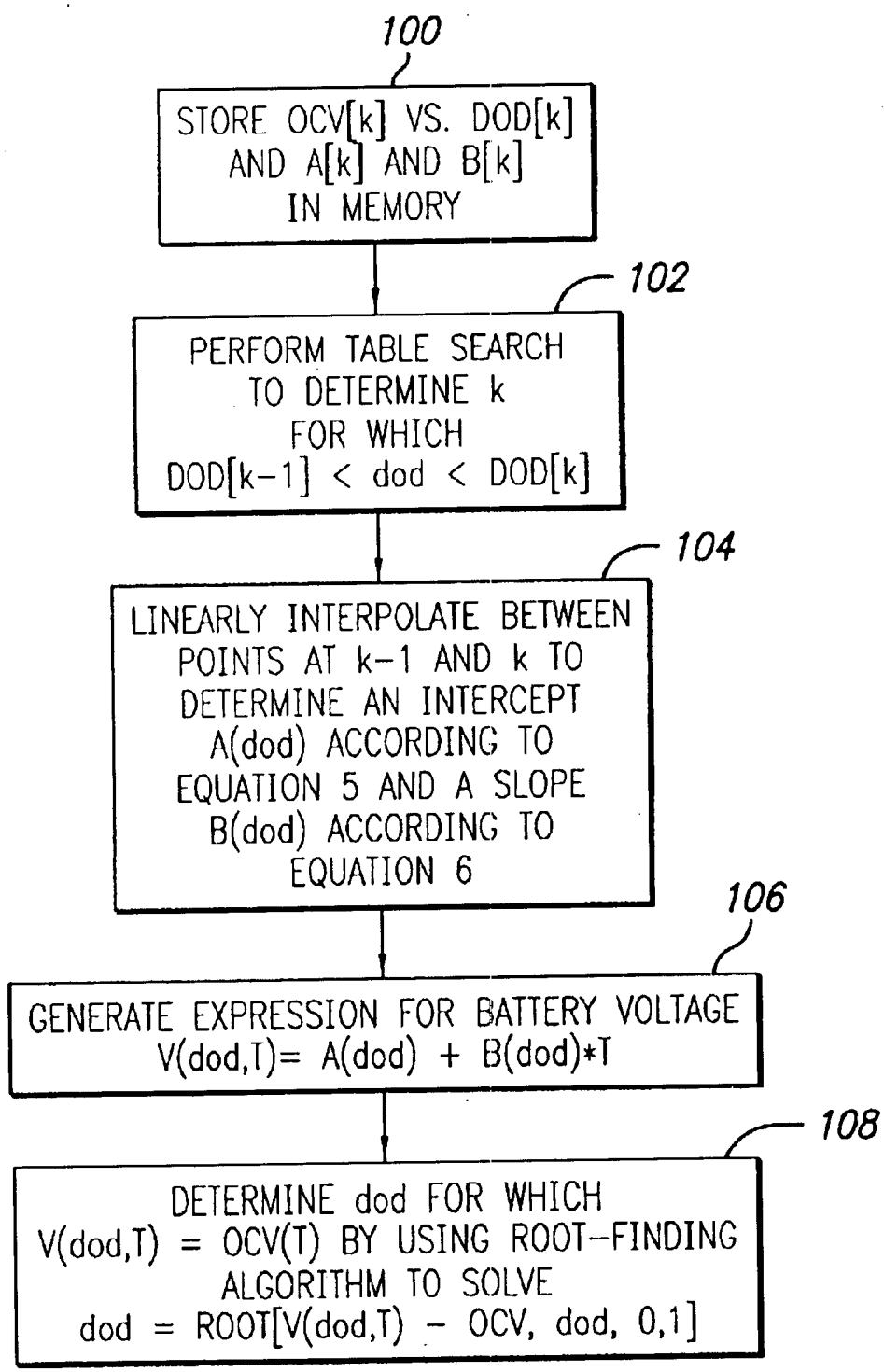
FIG. 5 is a flowchart of a program executed by an embedded processor in the block diagram of FIG. 1 to determine when open circuit battery voltage measurements should be made in order to appropriately determine SOC and/or DOD in the programs of FIGS. 2–4.

The flow chart of FIG. 5 indicates how embedded processor 13 of FIG. 1 uses the stored database to the determine DOD(OCV) i.e., to determine DOD as a function of both OCV and temperature T.

As indicated in block 100 of FIG. 5, the above-mentioned table of A[k] and B[k] required to interpolate the expression for V(DOD,T) is loaded into memory 15 of FIG. 1. As indicated in block 102 of FIG. 5, a table search of the database is performed using a conventional database search algorithm to find a value of the index "k" so that the particular DOD satisfies the expression DOD[k−1]<DOD<DOD [k].

Once a value of k satisfying this expression is found, an intercept A(DOD) and slope B(DOD) can be found by linear interpolation between the database points A[k−1], DOD[k−1] and A[k] and DOD[k], and B[k−1], DOD[k−1] and B[k] and DOD[k] as indicated in Equations 5 and 6:

$$A(DOD) = \frac{A_{k-1} \cdot DOD_k - DOD_{k-1} \cdot A_k}{DOD_k - DOD_{k-1}} + \frac{A_k - A_{k-1}}{DOD_k - DOD_{k-1}} \cdot DOD \qquad\text{(Eq. 5)}$$

$$B(DOD) = \frac{B_{k-1} \cdot DOD_k - DOD_{k-1} \cdot B_k}{DOD_k - DOD_{k-1}} + \frac{B_k - B_{k-1}}{DOD_k - DOD_{k-1}} \cdot DOD \qquad\text{Eq. 6)}$$

Block 104 of FIG. 5 indicates the computation of the intercept coefficient and slope so as to provide linear interpolation between the k−1 and k points of the above-mentioned database. The table search mentioned above is used to determine the index k used in the above equations and can be performed using various known table search algorithms, such as bi-section table search algorithms.

As indicated in block 106 of FIG. 5, the coefficients A(DOD) and B(DOD) can be thought of as coefficients for determining the temperature dependence of V(DOD,T), or as the intercepts and slopes which define the straight line equation $$V(DOD,T)=A(DOD)+B(DOD)*T.\qquad\text{(Eq. 7)}$$

The term V(DOD,T) of Equation 7 provides the battery voltage as a function of the interpolated DOD and the temperature T of the battery at the time when the corresponding OCV was measured.

Block 108 of FIG. 5 indicates the process of using a conventional root-finding algorithm to find a value of DOD that satisfies the expression OCV=V(DOD,T). As is the usual procedure, the root-finding algorithm uses a maximum possible root value of 1 and a minimum possible root value of 0 to bracket the value of the root to be determined in order to simplify the root-finding process. The root-finding process to be performed by the root-finding algorithm can be mathematically expressed by $$DOD = \text{root}\,[(V(DOD,T) - OCV, DOD, 0, 1)], \quad \text{(Eq. 8)}$$

which indicates that the root, or value of DOD, which causes $V(DOD,T)-OCV$ to be equal to 0 is iteratively determined according to the root-finding algorithm, within the boundaries 0 and 1.

Various well-known table-searching algorithms and root-algorithms can be readily utilized in the flow chart of FIG. 5. For example, see "Numerical Recipes in Fortran, Second Edition", William H. Press, Saul A. Teukolsky, William T. Vetterling, Brian P. Flannery, Cambridge University Press, 1992; for "Table-search" algorithms see page 110, and for "Root-finding" algorithms, see page 343.

When current flowing through the battery is small (i.e., not causing a voltage drop more than 1–2% of battery voltage) but is high enough to be measured, correction of voltage drop due to battery impedance can be made with good precision using the simple model $OCV=V-I*R(DOD)$. This is due to the fact that non-linear effects are negligible at low current, and transient effects are absent because the battery current was not changing for a long time. On the other hand, the R(DOD) dependence is usually smooth, since the error in resistance estimation due to deviation of DOD estimated from the measured voltage value without correction from the "true value" will be negligible. The corrected OCV can be then used to obtain an improved value of DOD as described above, to increase method's accuracy for the cases where battery current during passive phase is small but measurable.

The remaining run-time is computed from Qmax, and the battery impedance, updated as described above, is taken into consideration.

The determination of remaining run-time of the battery-powered device can be accomplished using the present value of Qmax as determined above. To accomplish this, the expression $$DOD = DOD0 + t*I/Qmax, \quad \text{(Eq. 9)}$$

where DOD0 is the starting DOD obtained using the above mentioned algorithms, and I is the load current that has been flowing for the battery for the amount of time t since the beginning of the present discharge cycle, is substituted into above Equation 1, to provide $$V(DOD0+t*I/Qmax,T(t)) = OCV(DOD0+t*I/Qmax) - I*R\_\text{battery-}(DOD0+t*I/Qmax,T(t)). \quad \text{(Eq. 10)}$$

The time variable t in Equation 10 is iterated by a conventional algorithm executed by embedded processor 13 to find a value of t which causes the battery voltage given by Equation 10 to be equal to the manufacturer's termination value Vmin. That value of t represents the total run-time t_total that could be supplied to the present load by the battery at the time at which the present discharge cycle started. The remaining run-time t_rem, i.e., the amount of time (measured from the present time) during which the battery (at its present depth of discharge) can continue to supply the present discharge current before the battery voltage decreases to Vmin, is computed by embedded processor 13 from the expression $$t\_\text{rem} = t\_\text{total} - \text{duration of present discharge cycle}. \quad \text{(Eq. 11)}$$

The capacity fade is the change from the original new battery zero-current capacity Qmax_new to the present value of zero-current capacity Qmax. The capacity fade can be expressed as a percentage of Qmax_new by means of the expression $$(Qmax\_new - Qmax)*100/Qmax\_new, \quad \text{(Eq. 13)}$$

or as a capacity retention fraction by means of the expression $$Qmax/Qmax\_new. \quad \text{(Eq. 13)}$$

The battery zero-capacity fade then can be expressed to the user in either of the foregoing forms, for example to indicate to the user when the battery should be replaced.

Furthermore, maximum useable capacity (Quseable) at the average current of the present load can be defined as the final DOD (DOD_fin) achieved at the moment when the termination voltage Vmin is reached (at the time t_total), which is subtracted from the DOD achieved at the most recent end of charge (DOD_charge) and the result is multiplied by Qmax. The maximum useable capacity can be calculated as in Eq. 14:

$$Quseable = (DOD0 + I*t\_\text{total}/Qmax - DOD\_charge)*Qmax. \quad \text{(Eq. 14)}$$

A "useable capacity fade" corresponding to the above-mentioned "useable capacity" is the change from the original new battery useable capacity Quseable_new to the present value of useable capacity Quseable. The useable capacity fade can be expressed as a percentage of the Quseable_new by means of the expression $$(Quseable\_new - Quseable)*100/Quseable\_new, \quad \text{(Eq. 15)}$$

or as a useable capacity retention fraction by means of the expression $$Quseable/Quseable\_new. \quad \text{(Eq. 16)}$$

The battery useable capacity fade then can be expressed to the user in either of the foregoing forms, for example to indicate to the user when the battery should be replaced.

"Usable energy" is the total time calculated for a constant power load multiplied by the average power delivered by the battery to the load. Since there is no analytical solution describing the calculation of V(t) for a constant power load, an iterative computing procedure is required. For example, instead of assuming a simple constant current load, constant power and constant resistance loads can be treated by iterative application of Equation (10) in order to determine the time when the termination voltage Vmin is reached.

In the case of a constant power load, the current for each iteration step is determined using Equation (17) below and then is substituted into Equation (10). The current thus obtained is integrated during subsequent iterations to provide a passed charge value Q, which is used to estimate DOD=DOD0+Q/Qmax and to calculate the corresponding OCV value v=OCV(DOD,T) and the corresponding internal battery resistance value R=R(DOD,T) for every step:

$$I(v, R, Pow) = \frac{1}{2 \cdot R} \cdot \left( \sqrt{v^2 + 4 \cdot R \cdot Pow} - v \right), \quad \text{(Eq. 17)}$$

where Pow is the average or constant power drawn by the load from the battery. The termination time t_term is determined to be the time when the voltage given by Equation (10) at the current calculated for present step, i.e., iteration, becomes less than Vmin. The usable energy can then be calculated as in Equation (18) below, for the case when iterative calculation started with DOD0=DOD_charge:

$$E\_useable = Pow * t\_term \qquad (Eq. 18)$$

A "useable energy fade" corresponding to the above-mentioned "useable energy" is the change from the original new battery useable energy Euseable_new at the average power load of the current user device or load device to the present value of useable capacity Euseable. The useable energy fade can be expressed as a percentage of the Euseable_new by means of the expression $$(Euseable\_new - Euseable) * 100 / Euseable\_new, \qquad (Eq. 19)$$

or as a useable capacity retention fraction by means of the expression $$Euseable / Euseable\_new. \qquad (Eq. 20)$$

The battery useable energy fade then can be expressed to the user in either of the foregoing forms, for example to indicate to the user when the battery should be replaced.

Pulsed or irregular loads can be treated using current, power or resistance as appropriate, averaged over a certain period of time of the present operation or averaged during a previous operation. Therefore, the present invention can be applied to any battery powered device regardless of its load behavior. More complex equations can be used instead of Equation (10) to determine the impedance effect on the terminal voltage of the battery, for example by incorporating transient effects and non-linear dependence of battery impedance on current. In particular, a more or less complex form of this equation can be selected depending on available computing power, and still remain within the scope of present invention.

Figure 6A:
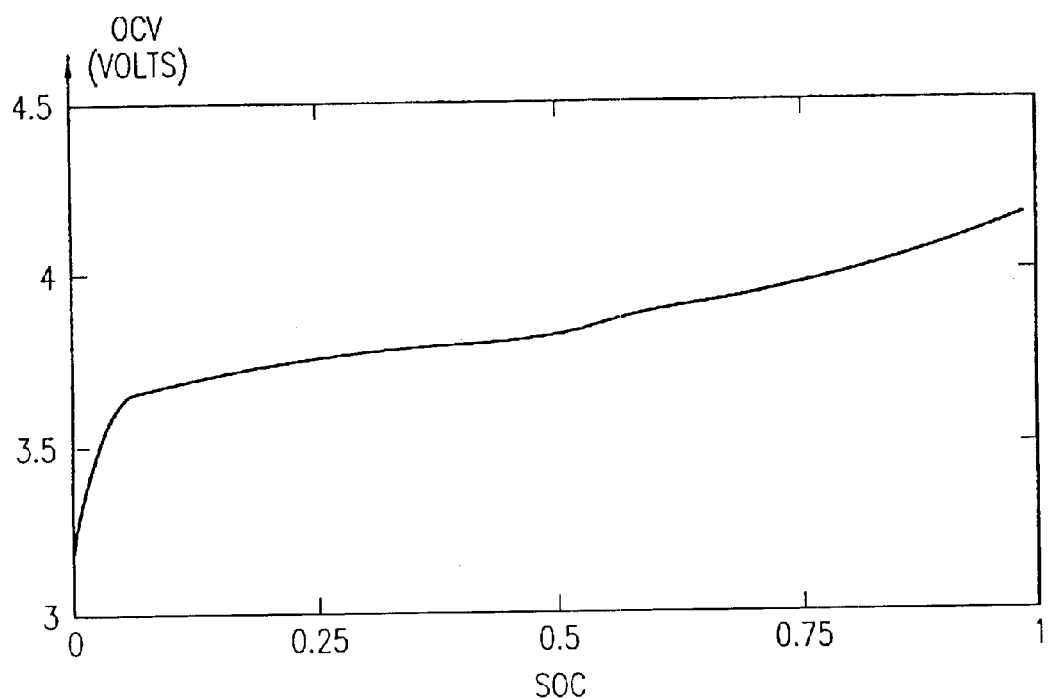
FIG. 6A is a curve of OCV (open circuit voltage) of a battery vs. SOC (state of charge) of a battery at a particular temperature.
Figure 6B:
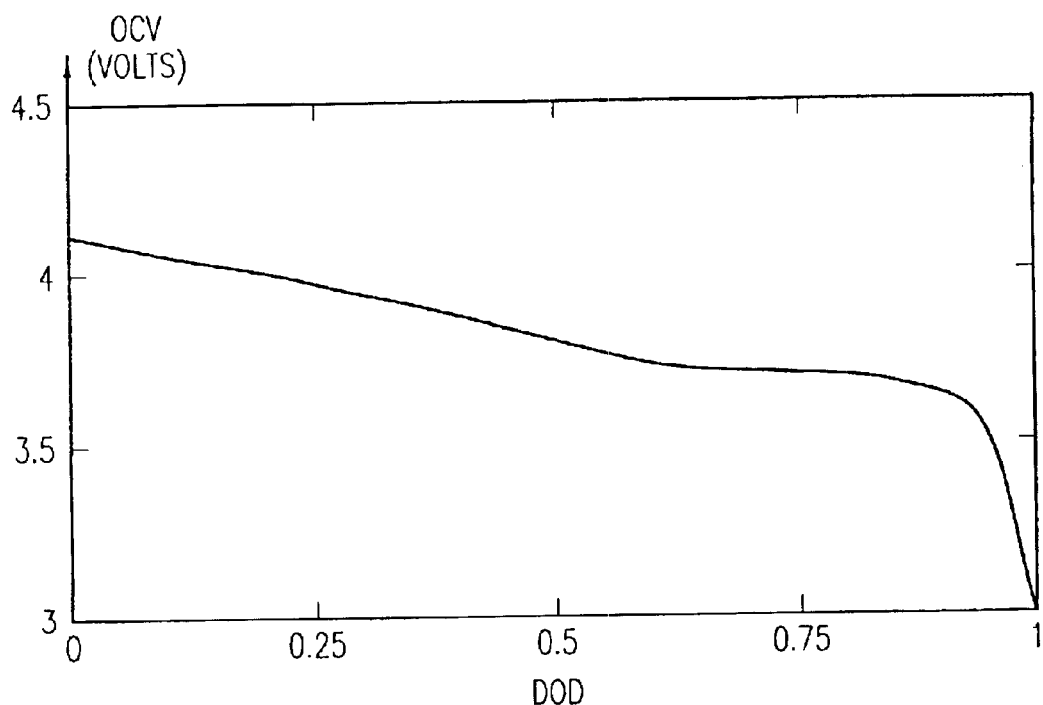
FIG. 6B is a curve of OCV (open circuit voltage) vs. DOD (depth of discharge) corresponding to the curve of FIG. 6A.

The curve shown in FIG. 6A can be used to obtain values of the battery state of charge SOC from the measured values of the open circuit battery voltage, and corresponding values of the DOD are determined from the expression DOD=1−SOC. Alternatively, the curve shown in FIG. 6B can be used to directly obtain values of the battery depth of discharge DOD.

The above described technique provides a battery monitoring device that can be interchangeably utilized in conjunction with different types of batteries from various manufacturers as long as their OCV voltage dependence on the battery DOD is similar, which may be very beneficial because the increase of the internal battery impedance with battery aging is known to be a characteristic that is largely dependent on the particular design of the battery. The present invention avoids need to develop a database for each different type of battery as required by the prior methods. Furthermore, the described invention results in higher precision by avoiding the effects of differences between various databases on the increase in computed internal battery impedance due to various temperatures, various charging conditions, and various other device-dependent conditions such as the load switching techniques being used.

Therefore, the technique of the present invention is more suitable to embedded applications of battery monitors than the prior art in which the effects of large transient effects due to normal battery powered device operation are not avoided.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, instead of table-defined linear interpolation for impedance dependence on DOD and temperature, different types of interpolation (for example spline, smoothing spline or specially selected functions) can be used. In this case, parameters of this spine or function will be updated when new resistance data-point has been measured. Instead of linear regression, different types of statistical data analysis such as non-linear fit to a function can be used to convert collected experimental data into a data-base parameter. Detection of load change can be made not based on fixed percentage of current change, but on a percentage which is changed adaptively dependent on load. Voltage and current can be subjected to averaging or other type of filtering before measurement. The values of internal impedance obtained as described herein can be used for other purposes than determining remaining capacity or run-time, for example as a diagnostic of battery health. Determining of remaining.capacity, run-time or other performance parameters using impedance obtained as described herein can be accomplished in ways other than as described above, for example by making a correlation function having resistance as one of its arguments and a desired performance parameter as a function result.

What is claimed is:

1. A method of determining an internal impedance of a battery, comprising:
   (a) analyzing current flowing through the battery or a voltage of the battery to determine if a transient condition due to a change of a load is occurring;
   (b) if a transient condition has been detected in step (a), determining when the transient condition has ended;
   (c) measuring a voltage of the battery while a current flows through the battery, and measuring the current;
   (d) determining a present depth of discharge (DOD) of the battery;
   (e) determining a value of open circuit voltage of the battery for the present DOD; and
   (f) computing the internal impedance by dividing the difference between the measured voltage of the battery and the value of the open circuit voltage at the present DOD by the current.

2. A method of determining an internal impedance of a battery, comprising:
   (a) operating a processor to analyze current flowing through the battery to determine if a transient condition due to change of current is occurring;
   (b) if a transient condition has been detected in step (a), operating the processor to determine when the transient condition has ended;
   (c) operating the processor to measure a voltage of the battery while a steady current is being supplied by the battery;
   (d) operating the processor to determine the present depth of discharge (DOD) of the battery;
   (e) operating the processor to access a database stored in a memory to determine a value of open circuit voltage of the battery for the present DOD; and
   (f) operating the processor to compute the internal impedance by dividing the difference between the measured voltage of the battery and the value of the open circuit voltage at the present DOD by an average value of the steady current.

3. The method of claim 2 including repeating steps (a)–(f) at predetermined intervals while the battery is being charged or discharged.

4. The method of claim 2 wherein step (c) includes operating the processor to measure the temperature of the battery.

5. The method of claim 4 wherein some or all of the current, voltage and temperature are averaged or otherwise filtered prior to use in step (f).

6. The method of claim 3 including detecting whether a significant load change has occurred after step (b) and if so, determining that a high frequency transient associated with the load change has occurred before performing step (c).

7. The method of claim 3 including updating the database using the value of the internal impedance computed in step (e).

8. The method of claim 2 wherein the determining of the present DOD in step (d) includes
  i. determining that the battery is in a zero-current relaxed condition such that no significant current flows for the battery through a time sufficiently long to ensure that the battery voltage is no longer appreciably changing;
  ii. measuring a starting open circuit voltage $V0$ and a starting temperature $T0$ of the battery;
  iii. operating the processor to use data in the database defining the dependence of open circuit voltage DOD and $T0$ ($OCV(DOD,T0)$) to find a value $DOD0$ of a starting DOD which satisfies the equation $V0=(OCV(DOD,T0))$;
  iv. detecting that the battery is being partially discharged or charged in the normal course of its usage and integrating current flowing through the battery to determine an amount of charge Q transferred until the present time; and
  v. calculating the present DOD as equal to $DOD=DOD0+Q/Qmax$, where $Qmax$ is the zero-current capacity of the battery.

9. The method of claim 8 wherein a small but measurable current $I\_small$ flowing through the battery during the voltage measurement of step (ii) and wherein after the determining of $DOD0$ in step (iii) the measured voltage is corrected by the value of a voltage drop across the internal resistance of the battery due to the small but measurable current $I\_small$ flowing through the battery according to the expression $$V0corr=V0-R(DOD0,T)*I\_small,$$

wherein $DOD0$ is subsequently recalculated using $V0corr$ instead of $V0$.

10. The method of claim 2 including determining a remaining run-time of the battery by obtaining or using a previously obtained value of a present total zero-current capacity $Qmax$ of the battery, integrating the current to determine a net transfer of charge from the battery, determining a value of total run-time that would be required to reduce the voltage of the battery to a predetermined lower limit, determining the duration of the integrating, and determining the remaining run-time by subtracting the duration of the integrating from the total run-time.

11. The method of claim 8 including determining a remaining run-time of the battery by obtaining or using a previously obtained value of the present total zero-current capacity $Qmax$ of the battery, integrating the current to determine a net transfer of charge Q from the battery, determining the value of the present DOD using values of $Qmax$, the starting depth of discharge $DOD0$ of the present discharge, and the value of the net transfer of charge Q, and calculating a value of remaining run-time that would be required to reduce the voltage of the battery to a predetermined lower limit starting with the battery at its present DOD.

12. The method of claim 10 wherein the determining of the total run-time includes operating the processor to utilize the database to determine the value of total run-time which causes the expression $$OCV(DOD0+t*I/Qmax,T)-I*R(DOD0+t*I/Qmax,T)$$

to be equal to the predetermined lower limit, wherein T is the battery temperature, I is the current flowing through the battery, and $R(DOD0+t*I/Qmax, T)$ is the internal resistance of the battery, wherein $DOD0+t*I/Qmax$ is the DOD value at time t, and the database includes a section with parameters defining the dependence $R(DOD,T)$ of the internal resistance as a function of DOD and T.

13. The method of claim 12 wherein the determining of the total run-time includes performing an iterative computing process to determine a value of total run-time that causes the expression $OCV(DOD0+t*I/Qmax,T)-I*R(DOD0+t*I/Qmax,T)$ to be equal to the predetermined lower limit for a constant power condition or a constant internal battery resistance condition.

14. The method of claim 12 wherein the database determines the value of the internal battery resistance as a function of the DOD and temperature of the battery is used in conjunction with measured values of internal battery resistance to update parameters of the database during battery operation.

15. The method of claim 10 wherein the obtaining of the present total zero-current capacity $Qmax$ of the battery includes
  i. determining that the battery is in a zero-current relaxed state such that no significant current flows to the battery for a sufficiently long time to ensure that the battery voltage is no longer changing appreciably;
  ii. measuring a starting open circuit voltage (OCV) of the battery;
  iii. detecting that the battery is being partially discharged or charged in the normal course of its usage and integrating current flowing through the battery to determine the amount of charge Q transferred, and then detecting a period of time when no significant current flows through the battery for a sufficiently long; amount of time to ensure that the battery voltage no longer is appreciably changing;
  iv. measuring an ending open circuit voltage of the battery;
  v. obtaining a starting depth of discharge corresponding to the starting open circuit voltage and an ending depth of discharge corresponding to the ending open circuit voltage; and
  vi. determining the value of the present zero-current capacity $Qmax$ by dividing the amount of charge Q transferred during step (iii) by the difference between the ending depth of discharge and the starting depth of discharge.

16. The method of claim 15 wherein data of the database represents the relationship between the open circuit voltage and the depth of discharge of the battery, wherein the determining of the total run-time includes operating the processor to utilize the database to determine the value of t that is equal to a total run-time which causes the expression $$OCV(DOD0+t*I/Qmax,T)-I*R(DOD0+t*I/Qmax,T)$$

to be equal to the predetermined lower limit, wherein T is the battery temperature, I is the current flowing through the battery, and $R(DOD0+t*I/Qmax, T)$ is the internal resistance of the battery, wherein the database includes a section including values of R(DOD0 +t*I/Qmax, T).

17. A method of determining a remaining run-time of a battery, comprising:
(a) determining an internal impedance of the battery by
   i. operating a processor to analyze current flowing through the battery to determine if a transient condition due to change of current is occurring,
   ii. if a transient condition has been detected, operating the processor to determine when the transient condition has ended,
   iii. operating the processor to measure a voltage of the battery while a steady current is being supplied by the battery,
   iv. operating the processor to determine the present depth of discharge (DOD) of the battery,
   v. operating the processor to access a database stored in a memory to determine a value of open circuit voltage of the battery for the present DOD, and
   iv. operating the processor to compute the internal impedance by dividing the difference between the measured voltage of the battery and the value of the open circuit voltage at the present DOD by an average value of the steady current; and
(b) determining a remaining run-time of the battery by obtaining or using a previously obtained value of a present total zero-current capacity Qmax of the battery, integrating the current to determine a net transfer of charge from the battery, determining a value of total run-time that would be required to reduce the voltage of the battery to a predetermined lower limit, determining the duration of the integrating, and determining the remaining run-time by subtracting the duration of the integrating from the total run-time.

18. A system for determining an internal impedance of a battery, comprising:
(a) a processor coupled to a digital bus, and a memory for storing data representing the relationship between the OCV (open circuit voltage) and DOD (depth of discharge) of the battery, a first ADC, and a second ADC all coupled to the digital bus;
(b) a first program stored in the memory for execution by the processor for
   i. analyzing current flowing through the battery to determine if a transient condition due to a change of the current is occurring and determining when the transient condition has ended, and
   ii. controlling the first ADC to measure a voltage of the battery while a steady current flows through the battery, the first ADC being coupled to the battery;
(c) a second program stored in the memory for execution by the processor for
   i. determining a present depth of discharge (DOD) of the battery, and
   ii. determining a value of open circuit voltage of the battery for the present DOD; and
(d) a third program stored in the memory for execution by the processor for computing the internal impedance by dividing the difference between the measured voltage of the battery and the value of the open circuit voltage at the present DOD by an average value of the steady current.

19. The system of claim 18 including a database stored in the memory.

20. The system of claim 18 wherein the first, second and third programs operate to repeatedly determine the internal impedance at predetermined intervals while the battery is being charged or discharged.

21. The system of claim 19 including a temperature sensor in thermal contact with the battery and a third ADC coupled to the digital bus for enabling the processor to measure the temperature of the battery.

22. The system of claim 20 including a fourth program for execution by the processor for detecting whether a significant load change has occurred and determining whether a high frequency transient associated with the load change has occurred.

23. The system of claim 22 wherein the fourth program updates database using computed values of the internal impedance.

24. The system of claim 19 wherein the second program is executed by the processor to determine the present DOD by
   i. determining that the battery is in a zero-current relaxed condition such that no significant current flows for the battery through a time sufficiently long to ensure that the battery voltage is no longer appreciably changing;
   ii. measuring a starting open circuit voltage V0 and a temperature T0 of the battery;
   iii. using data in the database defining the dependence of open circuit voltage DOD and T0 (OCV(DOD,T0)) to find a value DOD0 of a starting DOD which satisfies the equation V0=(OCV(DOD,T0));
   iv. detecting that the battery is being partially discharged or charged in the normal course of its usage and integrating current flowing through the battery to determine an amount of charge Q transferred until the present time; and
   v. calculating the present DOD as equal to DOD=DOD0+ Q/Qmax, where Qmax is the zero-current capacity of the battery.

25. The system of claim 24 including a fourth program for execution by the processor for correcting the starting open circuit voltage V0 by the value of a voltage drop across the internal resistance of the battery due to the small but measurable current I_small flowing through the battery according to the expression $$V0corr=V0-R(DOD0,T)*I\_small,$$

and wherein DOD0 is subsequently recalculated by means of the second program using V0corr instead of V0.

26. The system of claim 19 including a fourth program stored in a memory for execution by the processor for determining a remaining run-time of the battery by obtaining or using a previously obtained value of a present total zero-current capacity Qmax of the battery, integrating the current to determine a net transfer of charge from the battery, determining a value of total run-time that would be required to reduce the voltage of the battery to a predetermined lower limit, determining the duration of the integrating, and determining the remaining run-time by subtracting the duration of the integrating from the total run-time.

27. The system of claim 24 including a fourth processor stored in the memory for execution by the processor for determining a remaining run-time of the battery by obtaining or using a previously obtained value of the present total zero-current capacity Qmax of the battery, integrating the current to determine a net transfer of charge Q from the battery, determining the value of the present DOD using values of Qmax, the starting depth of discharge DOD0 of the present discharge, and the value of the net transfer of charge Q, and calculating a value of remaining run-time that would be required to reduce the voltage of the battery to a predetermined lower limit starting with the battery at its present DOD.

28. The system of claim 26 wherein the determining of the total run-time includes operating the processor to utilize the database to determine the value of total run-time which causes the expression $$OCV(DOD0+t*I/Qmax,T)-I*R(DOD0+t*I/Qmax,T)$$

to be equal to the predetermined lower limit, wherein T is the battery temperature, I is the current flowing through the battery, and $R(DOD0+t*I/Qmax, T)$ is the internal resistance of the battery, wherein $DOD0+t*I/Qmax$ is the DOD value at time t, and the database includes a section with parameters defining the dependence $R(DOD,T)$ of the internal resistance as a function of DOD and T.

29. The system of claim 28 wherein the determining of the total run-time includes performing an iterative computing process to determine a value of total run-time that causes the expression $OCV(DOD0+t*I/Qmax,T)-I*R(DOD0+t*I/Qmax,T)$ to be equal to the predetermined lower limit for a constant power condition or a constant internal battery resistance condition.

30. The system of claim 28 wherein the database determines the value of the internal battery resistance as a function of the DOD and temperature of the battery is used in conjunction with measured values of internal battery resistance to update parameters of the database during battery operation.

31. The system of claim 26 including a fifth program for execution by the processor to obtain the present total zero-current capacity Qmax of the battery by
   i. determining that the battery is in a zero-current relaxed state such that no significant current flows to the battery for a sufficiently long time to ensure that the battery voltage is no longer changing appreciably;
   ii. measuring a starting open circuit voltage (OCV) of the battery;
   iii. detecting that the battery is being partially discharged or charged in the normal course of its usage and integrating current flowing through the battery to determine the amount of charge Q transferred, and then detecting a period of time when no significant current flows through the battery for a sufficiently long; amount of time to ensure that the battery voltage no longer is appreciably changing;
   iv. measuring an ending open circuit voltage of the battery;
   v. obtaining a starting depth of discharge corresponding to the starting open circuit voltage and an ending depth of discharge corresponding to the ending open circuit voltage; and
   vi. determining the value of the present zero-current capacity Qmax by dividing the amount of charge Q transferred during step (iii) by the difference between the ending depth of discharge and the starting depth of discharge.

32. The system of claim 31 wherein data of the database represents the relationship between the open circuit voltage and the depth of discharge of the battery, wherein the determining of the total run-time includes operating the processor to utilize the database to determine the value of t that is equal to a total run-time which causes the expression $$OCV(DOD0+t*I/Qmax,T)-I*R(DOD0+t*I/Qmax,T)$$

to be equal to the predetermined lower limit, wherein T is the battery temperature, I is the current flowing through the battery, and $R(DOD0+t*I/Qmax, T)$ is the internal resistance of the battery, wherein the database includes a section including values of $R(DOD0+t*I/Qmax, T)$.

33. A system for determining a remaining run-time of a battery, comprising:
   (a) a processor coupled to a digital bus, and a memory for storing data representing the relationship between the OCV (open circuit voltage) and DOD (depth of discharge) of the battery, a first ADC, and a second ADC all coupled to the digital bus;
   (b) a first program stored in the memory for execution by the processor for determining an internal impedance of the battery by analyzing current flowing through the battery to determine if a transient condition due to change of current is occurring, determining when the transient condition has ended, measuring a voltage of the battery while a steady current is being supplied by the battery, determining the present depth of discharge (DOD) of the battery, accessing a database stored in a memory to determine a value of open circuit voltage of the battery for the present DOD, and computing the internal impedance by dividing the difference between the measured voltage of the battery and the value of the open circuit voltage at the present DOD by an average value of the steady current; and
   (c) a second program stored in the memory for execution by the processor for determining a remaining run-time of the battery by obtaining or using a previously obtained value of a present total zero-current capacity Qmax of the battery, integrating the current to determine a net transfer of charge from the battery, determining a value of total run-time that would be required to reduce the voltage of the battery to a predetermined lower limit, determining the duration of the integrating, and determining the remaining run-time by subtracting the duration of the integrating from the total run-time.

34. A system for determining an internal impedance of a battery, comprising:
   (a) means for operating a processor to analyze current flowing through the battery to determine if a transient condition due to change of current is occurring;
   (b) means for operating the processor to determine when a detected transient condition has ended;
   (c) means for operating the processor to measure a voltage of the battery while a steady current is being supplied by the battery;
   (d) means for operating the processor to determine the present depth of discharge (DOD) of the battery;
   (e) means for operating the processor to access a database stored in a memory to determine a value of open circuit voltage of the battery for the present DOD; and
   (f) means for operating the processor to compute the internal impedance by dividing the difference between the measured voltage of the battery and the value of the open circuit voltage at the present DOD by an average value of the steady current.

35. The system of claim 34 wherein the various processor operating means performed their respective functions at predetermined intervals while the battery is being charged or discharged.

36. The system of claim 34 wherein the means for operating the processor to determine the present depth of discharge (DOD) of the battery includes
   i. means for determining that the battery is in a zero-current relaxed condition such that no significant current flows for the battery through a time sufficiently long to ensure that the battery voltage is no longer appreciably changing;

ii. means for measuring a starting open circuit voltage $V0$ and a temperature $T0$ of the battery;

iii. means for operating the processor to use data in the database defining the dependence of open circuit voltage DOD and $T0$ (OCV(DOD,T0)) to find a value $DOD0$ of a starting DOD which satisfies the equation $V0=(OCV(DOD,T0))$;

iv. means for detecting that the battery is being partially discharged or charged in the normal course of its usage and integrating current flowing through the battery to determine an amount of charge Q transferred until the present time; and v. means for calculating the present DOD as equal to $DOD=DOD0+Q/Qmax$, where Qmax is the zero-current capacity of the battery.

37. The system of claim 34 including means for determining a remaining run-time of the battery by obtaining or using a previously obtained value of a present total zero-current capacity Qmax of the battery, integrating the current to determine a net transfer of charge from the battery, determining a value of total run-time that would be required to reduce the voltage of the battery to a predetermined lower limit, determining the duration of the integrating, and determining the remaining run-time by subtracting the duration of the integrating from the total run-time.

* * * * *